United States Patent
Zhan et al.

(10) Patent No.: US 9,051,814 B2
(45) Date of Patent: Jun. 9, 2015

(54) REAL-TIME PROGNOSTIC ON DOWNHOLE PRINTED CIRCUIT BOARD ASSEMBLY OF MEASUREMENT-WHILE-DRILLING/ LOGGING-WHILE-DRILLING

(75) Inventors: Sheng Zhan, Houston, TX (US); Izhar Ahmad, Spring, TX (US)

(73) Assignee: Baker Hughes Incorporated, Houston, TX (US)

( * ) Notice: Subject to any disclaimer, the term of this patent is extended or adjusted under 35 U.S.C. 154(b) by 803 days.

(21) Appl. No.: 13/251,396

(22) Filed: Oct. 3, 2011

(65) Prior Publication Data

US 2012/0084008 A1    Apr. 5, 2012

Related U.S. Application Data

(60) Provisional application No. 61/389,898, filed on Oct. 5, 2010.

(51) Int. Cl.
| | |
|---|---|
| *G01V 1/40* | (2006.01) |
| *E21B 41/00* | (2006.01) |
| *G01M 99/00* | (2011.01) |
| *G01R 31/28* | (2006.01) |

(52) U.S. Cl.
CPC ............. *E21B 41/00* (2013.01); *G01M 99/007* (2013.01); *G01R 31/2817* (2013.01)

(58) Field of Classification Search
CPC .................................................. G01R 31/2817
USPC ............................................................ 702/6
See application file for complete search history.

(56) References Cited

U.S. PATENT DOCUMENTS

| | | |
|---|---|---|
| 5,764,073 A | 6/1998 | Sadamatsu |
| 6,493,850 B2 | 12/2002 | Venugopal et al. |
| 6,834,233 B2 | 12/2004 | Economides et al. |
| 7,165,612 B2 | 1/2007 | McLaughlin |
| 7,216,050 B1 | 5/2007 | Bachman et al. |
| 2005/0005186 A1* | 1/2005 | Goebel et al. ...................... 714/1 |
| 2005/0197813 A1* | 9/2005 | Grayson ........................ 703/10 |
| 2007/0265806 A1 | 11/2007 | Kim |
| 2009/0160457 A1* | 6/2009 | Spuhler et al. ................ 324/537 |
| 2010/0180418 A1* | 7/2010 | Bodden et al. ............. 29/402.03 |

OTHER PUBLICATIONS

International Search Report and Written Opinion dated Apr. 27, 2012 for International Application No. PCT/US2011/054730.

* cited by examiner

*Primary Examiner* — Janet Suglo
(74) *Attorney, Agent, or Firm* — Cantor Colburn LLP (57) ABSTRACT

A method and apparatus for estimating a time to failure of an electronic component used in a downhole environment is disclosed. A stress is applied to the electronic component to cause failure of a plurality of prognostic sensors associated with the electronic component, wherein the stress level at which a prognostic sensor fails is indicative of a stress level at which the electronic component fails. Failure times are obtained due to the applied stress for the plurality of prognostic sensors. A trend is determined from the obtained failure times of the prognostic sensors. The time of failure of the electronic component is estimated from the determined trend.

19 Claims, 5 Drawing Sheets

REAL-TIME PROGNOSTIC ON DOWNHOLE PRINTED CIRCUIT BOARD ASSEMBLY OF MEASUREMENT-WHILE-DRILLING/ LOGGING-WHILE-DRILLING

CROSS-REFERENCE TO RELATED APPLICATIONS

The present application claims priority to U.S. Provisional Application Ser. No. 61/389,898, filed Oct. 5, 2010.

BACKGROUND OF THE DISCLOSURE

Drilling tools used in petroleum exploration typically include one or more electronic components or printed circuit board assemblies (PCBAs) for performing various operations downhole. In a downhole environment, these PCBAs are subjected to various thermo-mechanical stresses, which can cause wear or failure. Therefore, they tend to have a reduced life span that requires maintenance and repair on an accelerated basis. However, when drilling operations have to be stopped for any reason, including tool maintenance, time and money is lost. Thus, it is desirable to implement maintenance strategies for the drilling tool that are cost effective. In order to implement such a strategy, it is useful to be able to determine wear and failure on the PCBA and predict a remaining lifetime for a PCBA. Therefore, the present disclosure provides methods and apparatus for estimating a remaining lifetime for a PCBA used in a downhole environment.

SUMMARY OF THE DISCLOSURE

In one aspect, the present disclosure provide a method of estimating a time to failure of an electronic component used in a downhole environment, including: applying a stress to cause failure of a plurality of prognostic sensors associated with the electronic component, wherein the stress level at which a prognostic sensor fails is indicative of a stress level at which the electronic component fails; obtaining failure times of the plurality of prognostic sensors; determining a trend from the obtained failure times of the prognostic sensors; and estimating the time of failure of the electronic component from the determined trend.

In another aspect, the present disclosure provides an apparatus for estimating a time to failure of an electronic component in a downhole environment that includes a plurality of prognostic sensors associated with the electronic component configured to fail at stress levels indicative of a failure stress level of the electronic component; and a processor configured to: obtain failure times of the prognostic sensors, determine a trend of the obtained failure times, and estimate the time of failure of the electronic component from the determined trend.

Examples of certain features of the apparatus and method disclosed herein are summarized rather broadly in order that the detailed description thereof that follows may be better understood. There are, of course, additional features of the apparatus and method disclosed hereinafter that will form the subject of the claims.

BRIEF DESCRIPTION OF THE DRAWINGS

For detailed understanding of the present disclosure, references should be made to the following detailed description, taken in conjunction with the accompanying drawings, in which like elements have been given like numerals and wherein.

DETAILED DESCRIPTION OF THE DISCLOSURE

The present disclosure provides a method for determining a time to failure for a an electronic component such as a printed circuit board assembly (PCBA) used in a downhole environment, such as on a measurement-while-drilling tool or a logging-while-drilling tool. In one embodiment, measurements related to a failure of an electronic component can be used to determine a wear-out model that relates reliability of the electronic component to a time of use. The wear-out model can be used to determine, for example, a remaining life of a selected electronic component in use downhole.

Figure 1:
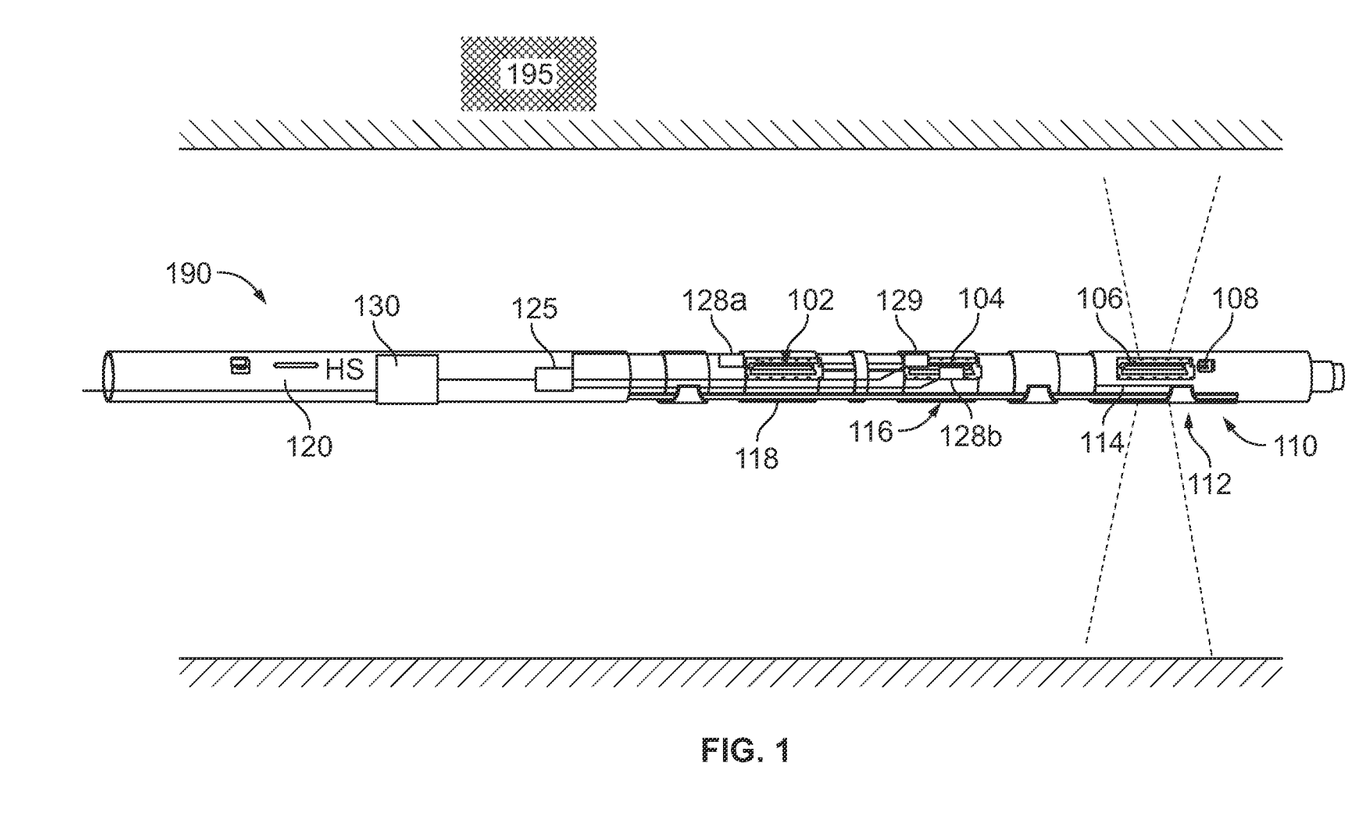
FIG. 1 shows a detailed illustration of an exemplary drilling assembly used in drilling boreholes and which includes one or more printed circuit board assemblies (PCBAs) for performing various operations of the drilling assembly.

FIG. 1 is a detailed illustration of an exemplary drilling assembly 190 used in drilling a borehole 180. The drilling assembly 190 includes various formation evaluation sensors or devices (also referred to as measurement-while-drilling, "MWD," or logging-while-drilling, "LWD," sensors) for determining selected properties of the formation 195 surrounding the drilling assembly 190 such as, for example, resistivity, density, porosity, permeability, acoustic properties, nuclear-magnetic resonance properties, corrosive properties of the fluids or formation downhole, salt or saline content. Drilling assembly 190 includes a sonde 120 which includes one or more exemplary electronic components such as a printed circuit board assembly (PCBA) which can be used, for example, for operation of a power supply 102, a master memory board 104, a pressure/gamma controller board 106, read out board 108, pressure sensor 110, battery 112, gamma board 114, transmitter board 116 and receiver board 118. The exemplary PCBAs in other embodiments can be used to operated an accelerometer board, and magnetic core driver, a low voltage power supply (LVPS_modem), and annular pressure transducer, a magnetometer, among others. The PCBAs are affected by wear and use in downhole environmental conditions as well as wear from being subjected to various drilling operation parameters.

The exemplary drilling assembly 190 further includes a variety of measurement sensors, such as exemplary measurement sensors 128a,b for obtaining a measurement of one or more parameters of the drilling assembly (such as velocity, vibration, bending moment, acceleration, oscillations, whirl, stick-slip, etc.) as well as drilling operating parameters, such as weight-on-bit, fluid flow rate, pressure, temperature, rate of penetration, azimuth, tool face, drill bit rotation, etc. In one embodiment, the measurement sensor can be at an adjacent location to a PCBA, such as sensor 128a is adjacent to power supply PCBA 102. In another embodiment, the measurement sensor can be integrated into a PCBA such as sensor 128b is integrated into master memory board 104. Thus, the measurement sensors 128a,b experience substantially the same conditions as are experienced by the associated PCBA. The exemplary PCBA can also include one or more associated prognostic sensors 129 for providing data related to a time to failure of the associated PCBA.

The one or more measurement sensors 128a,b are coupled to a processor 125 that in one aspect determines a wear-out model of the PCBA using the exemplary methods described herein. Telemetry system 130 is located on the BHA 190 for providing data to a surface location. In an alternate embodiment, the processor determining the wear-out model of the PCBA is located at the surface location and measurements are provided from the one or more sensors 128a,b to the surface processor via the telemetry unit 206. In one embodiment, the processor assigns stress levels to the measurements obtained at the measurement sensors 128a,b using the exemplary methods discussed below. In another aspect, the processor 125 is coupled to the one or more prognostic sensors 129 and obtains data related to a failure time of the prognostic sensors and determines a time to failure of the associated PCBA.

It is understood that while the present disclosure is described with respect to PCBAs, this is not meant as a limitation of the disclosure. The methods discloses herein can be equally applied to any electronic component. An electronic component may include active components, such as PCBAs, transistors, etc., or passive components, such as resistors, capacitors, etc.

In one embodiment, a wear-out model is determined from a fit of stress measurements due to drilling operation parameters and point-of-failure of a PCBA to a distribution. Drilling parameters are measured and a drilling profile of the PCBA is obtained from the measured drilling parameters. A drilling profile typically includes measurements taken of a plurality of drilling parameters. In the exemplary embodiment, the drilling profile includes the drilling parameters of lateral vibration, axial vibration, stick-slip and temperature. For each parameter, a stress due to a selected drilling parameter is categorized according to predefined stress levels. Exemplary drilling parameters and their exemplary stress levels are shown in Tables 1-4. Table 1 shows an exemplary measurement table having predefined stress levels for lateral vibration measurements.

TABLE 1

| Lateral Vibration | |
|---|---|
| Level | g_RMS |
| 0 | $0.0 \leq x < 0.05$ |
| 1 | $0.5 \leq x < 1.0$ |
| 2 | $1.0 \leq x < 2.0$ |
| 3 | $2.0 \leq x < 3.0$ |
| 4 | $3.0 \leq x < 5.0$ |
| 5 | $5.0 \leq x < 8.0$ |
| 6 | $8.0 \leq x < 15.0$ |
| 7 | $15.0 \leq x$ |

Lateral vibration levels are defined from 0-7 and are derived from a measurement of lateral vibration in units of g_RMS (g_Root Mean Squared). Acceleration is often expressed in the unit in terms of the Earth's natural gravitational acceleration, g=9.91 meters per second squared. The root mean squared (RMS) value of g gives an indication of both the mean and dispersion of a plurality of acceleration measurements and is indicative of the amount of detrimental energy experienced during a selected period of vibration. Thus, a measurement of 1.5 g_RMS for lateral vibration is recorded as a stress level 3.

Table 2 shows an exemplary measurement table having predefined stress levels for stick slip measurements.

TABLE 2

| Stick Slip | | |
|---|---|---|
| Level | g_RMS | |
| 0 | $0.0 \leq s\_1 < 0.2$ | Normal State |
| 1 | $0.2 \leq x < 0.4$ | Normal State |
| 2 | $0.4 \leq x < 0.6$ | Torsional Oscillations |
| 3 | $0.6 \leq x < 0.8$ | Torsional Oscillations |
| 4 | $0.8 \leq x < 1.0$ | Torsional Oscillations |
| 5 | $1.0 \leq x < 1.2$ | Stick Slip |
| 6 | $1.2 \leq s\_1$ | Stick Slip |
| 7 | $s\_2 > 0.1$ | Backward Rotation |

Stick slip levels are defined from 0-7 and are derived from the parameters s_1 and s_2 which are related to instantaneous RPM measurements of stick-slip. The parameter s_1 is a normalized difference between minimum RPM and maximum RPM detected over a measurement period as shown in Eq. (1):

$$s\_1 = \frac{\text{max\_RPM} - \text{min\_RPM}}{2*\text{Avg\_RPM}} \qquad \text{Eq. (1)}$$

The parameter s_2 is a percentage of time in which the downhole tool rotates backward as a result of the stick-slip movement of the drill string.

Table 3 shows an exemplary measurement table having predefined stress levels for axial vibration measurements.

TABLE 3

| Axial Vibration | |
|---|---|
| Level | g_RMS |
| 0 | $0.0 \leq x < 0.05$ |
| 1 | $0.5 \leq x < 1.0$ |
| 2 | $1.0 \leq x < 2.0$ |
| 3 | $2.0 \leq x < 3.0$ |
| 4 | $3.0 \leq x < 5.0$ |
| 5 | $5.0 \leq x < 8.0$ |
| 6 | $8.0 \leq x < 15.0$ |
| 7 | $15.0 \leq x$ |

Axial vibration levels are defined from 0-7 and are derived from measurements of axial vibration in units of g_RMS.

Table 4 shows an exemplary measurements table having predefined stress levels for temperature measurements.

TABLE 4

| Temperature | |
|---|---|
| Level | g_RMS |
| 0 | $15 \leq \text{Temp} < 85$ |
| 1 | $85 \leq \text{Temp} < 125$ |
| 2 | $135 \leq \text{Temp} < 150$ |
| 3 | $155 \leq \text{Temp} < 165$ |
| 4 | $165 \leq \text{Temp} < 175$ |
| 5 | $175 \leq \text{Temp} < 185$ |
| 6 | $185 \leq \text{Temp} < 200$ |
| 7 | $200 \leq \text{Temp}$ |

Temperature levels are defined from 0-7 and are a derived from a measure of temperature exposure over time. Tables 1-4 are used to quantify stress measurements experienced at a PCBA.

Tables 5-8 shows a set of drilling parameters measured for an exemplary PCBA in a downhole environment and binned according to the predefined stress levels of Tables 1-4, respectively. The top row of each of Tables 5-8 indicate the stress levels and the bottom row indicates the amount of time in hours that the PCBA experiences stress at the selected stress level. Time is indicated in hours.

TABLE 5

Lateral Vibration Levels (hrs)

| 0 | 1 | 2 | 3 | 4 | 5 | 6 | 7 | Total |
|---|---|---|---|---|---|---|---|---|
| 30.3 | 11.9 | 37.9 | 16.7 | 2.5 | 0.2 | 0 | 0 | 90.5 |

TABLE 6

Stick-slip Levels (hrs)

| 0 | 1 | 2 | 3 | 4 | 5 | 6 | 7 | Total |
|---|---|---|---|---|---|---|---|---|
| 58.8 | 19.2 | 14.8 | 3.6 | 0.9 | 0.4 | 1.7 | 1.8 | 101.2 |

TABLE 7

Axial Vibration Levels (hrs)

| 0 | 1 | 2 | 3 | 4 | 5 | 6 | 7 | Total |
|---|---|---|---|---|---|---|---|---|
| 58.2 | 38.7 | 2.3 | 0.2 | 0 | 0 | 0 | 0 | 99.4 |

TABLE 8

Temperature Levels (hrs)

| 0 | 1 | 2 | 3 | 4 | 5 | 6 | 7 | Total |
|---|---|---|---|---|---|---|---|---|
| 13.8 | 79.7 | 0 | 0 | 0 | 0 | 0 | 0 | 93.5 |

In one aspect, the values of Tables 5-8 can provide a stress profile for the exemplary PCBA at a time of failure of the PCBA. In addition, the stress profile can be provided for any selected time, including a time at which use of the PCBA is suspended. In one aspect, one or more PCBAs can be tested to failure and the measured stress profile are used to determine a wear-out model of the PCBA using, for example, Weibull analysis. Various aspects of Weibull analysis are described below with respect to Eqs. (2)-(8).

Weibull analysis can be used to classify failures and to model failure behavior and involves fitting a time to fail distribution to failure data. Given n time-varying stresses $$\bar{X}=(X_1(t), X_2(t), \ldots, X_n(t)) \qquad \text{Eq. (2)}$$

where t is time and the stresses can be lateral vibration, stick-slip, axial vibration and temperature in one embodiment, a life-stress relationship $s(t, \bar{X})$ is given by:

$$s(t, \bar{X}) = \exp\left(\alpha_0 + \sum_{j=1}^{n} \alpha_j x_j(t)\right) \qquad \text{Eq. (3)}$$

where $a_j$ are model parameters related to the exemplary stresses of Eq. (2). A reliability function of a PCBA under multiple stresses is then given by:

$$R(t,\bar{X}) = \exp\{-(I(t,\bar{X}))^\beta\} \qquad \text{Eq. (4)}$$

where $\beta$ is a shape parameter of a Weibull distribution and $$I(t, \bar{X}) = \int_0^t \frac{\exp\left(-\sum_{j=1}^{n} \alpha_j x_j(u)\right)}{C} du \qquad \text{Eq. (5)}$$

in which C is a normalization constant. Therefore, a related probability density function is:

$$f(t,\bar{X}) = \beta s(t,\bar{X}) I(t,\bar{X})^{\beta-1} \exp\{-(I(t,\bar{X}))^\beta\} \qquad \text{Eq. (6)}$$

Estimation of statistical parameters can be accomplished via a suitable method such as maximum likelihood estimation methods. Confidence intervals can be approximated using suitable methods, such as a Fisher matrix approach. Once the statistical parameters are determined, other characteristics of interest can be obtained from standard statistical properties (e.g. mean life, failure rate, etc.). The log-likelihood function for the stresses is:

$$\ln(L) = \Delta \qquad \text{Eq. (7)}$$

$$= \sum_{i=1}^{F_e} N_i \ln[\beta s(T_i, \bar{x}_i)(I(T_i, \bar{x}_i))^{\beta-1}] - \sum_{i=1}^{F_e} N_i (I(T_i, \bar{x}_i)) -$$

$$\sum_{i=1}^{S} N'_i (I(T'_i, \bar{x}'_i))^\beta + \sum_{i=1}^{FI} N''_i \ln[R''_{Li} - R''_{Ri}]$$

where $F_e$ is the number of groups of exact time-to-failure data points, $N_i$ is the number of times-to-failure in the $i^{th}$ time-to-failure data group, $T_i$ is the failure time of the $i^{th}$ group, S is the number of groups of suspension data points, $N'_i$ is the number of suspensions in the $i^{th}$ group of suspension data points, $T'_i$ is the running time of the $i^{th}$ suspension data group, FI is the number of interval data groups, $N''_i$ is the number of intervals in the $i^{th}$ group of data intervals, $T''_i$ is the beginning of the $i^{th}$ interval, $T''_{Ri}$ is the ending of the $i^{th}$ interval and:

$$R''_{Li}(T''_{Li}, x''_i) = \exp\{-(I(T''_{Li}, x''_i))^\beta\}$$

$$R''_{Ri}(T''_{Ri}, x''_i) = \exp\{-(I(T''_{Ri}, x''_i))^\beta\} \qquad \text{Eq. (8)}$$

Figure 2:
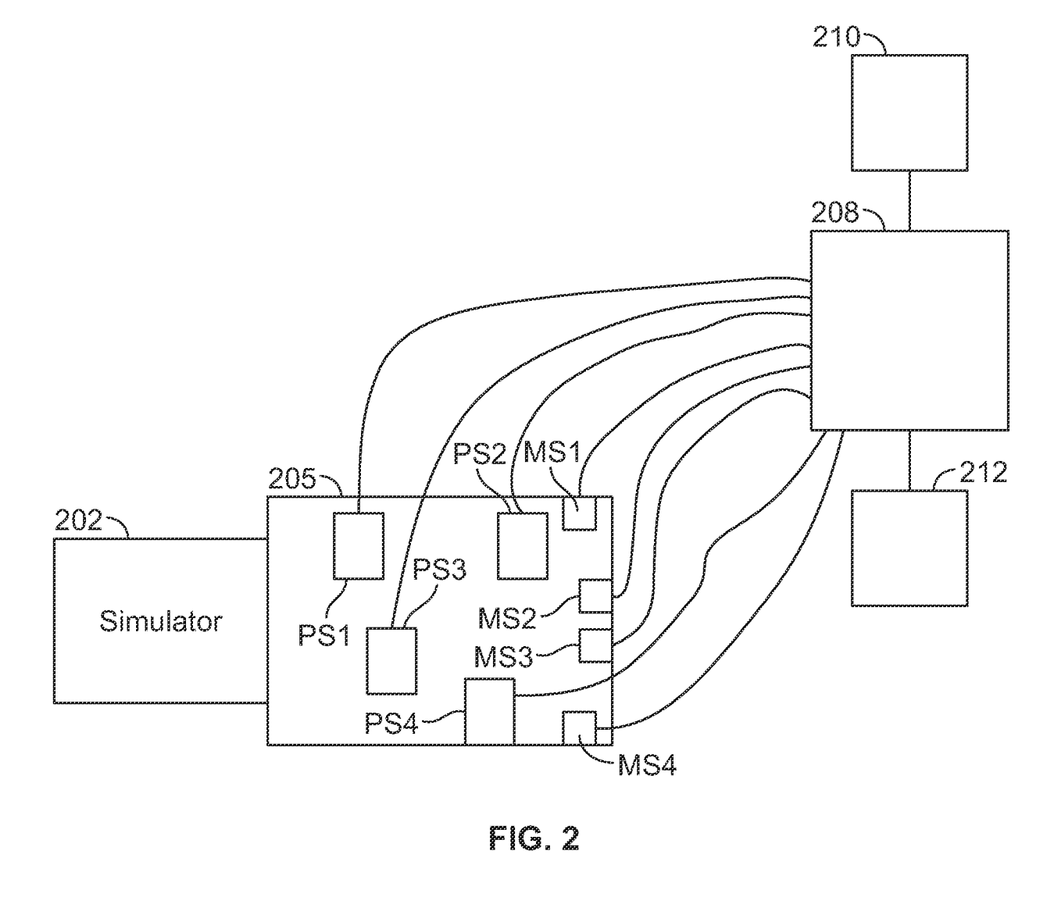
FIG. 2 shows an exemplary apparatus for obtaining prognostic measurements related to a lifespan of a PCBA in one embodiment of the present disclosure.

FIG. 2 shows an exemplary controlled testing environment for estimating a time to failure of an exemplary PCBA. PCBA 205 is coupled to a simulator 202 which simulates one or more drilling parameters such as lateral vibration, axial vibration, stick-slip, and temperature, among others. One or more exemplary measurement sensors MS1-MS4 can be coupled to the PCBA to record a stress level at the PCBA. In an exemplary embodiment, MS1 is responsive to an axial vibration, MS2 is responsive to a stick-slip vibration, MS3 is responsive to a lateral vibration and MS4 is responsive to temperature. In addition, the PCBA 205 has one or more prognostic sensors PS1-PS4 integrated with the PCBA or at a nearby location to the PCBA for sensing the various drilling parameters at the PCBA. In the exemplary testing environment of FIG. 2, a PCBA can be tested at an accelerated pace. For example, a PCBA may be subjected to 10 hours of 100° temperature during testing in order to simulate an effect of 40 hours of 150° temperature which may be typical of borehole conditions. A prognostic sensor can be selected to fail at an accelerated rate to the PCBA, the accelerated rate indicated by an acceleration factor. The prognostic sensor thus fails at a time prior to a time of failure of the PCBA. Failure times of multiple prognostic sensors are used to estimate the time of failure of the PCBA. In one embodiment, an acceleration factor and estimated time to failure of a prognostic sensor is determined from a wear-out model such as the exemplary wear-out model described herein.

Processor 208 is coupled to the exemplary measurement sensors M1-M4 for monitoring the stress levels at the PCBA. Processor 208 is also coupled to the exemplary prognostic sensors P1-P4 to obtain a time of failure of the prognostic sensors. In one aspect, the processor can correlate a failure of a prognostic sensor to measurements obtained at the measurement sensors to obtain a wear-out model for the PCBA using for example a Weibull analysis. In another aspect, processor 208 can estimate a time to failure of the PCBA using the failure times of the prognostic sensors. The processor is coupled to a program module 210 which supplies instructions to the processor for performing calculations related to various aspects of the present disclosure and a recording medium 212 for storing various results of the calculations.

Figure 3:
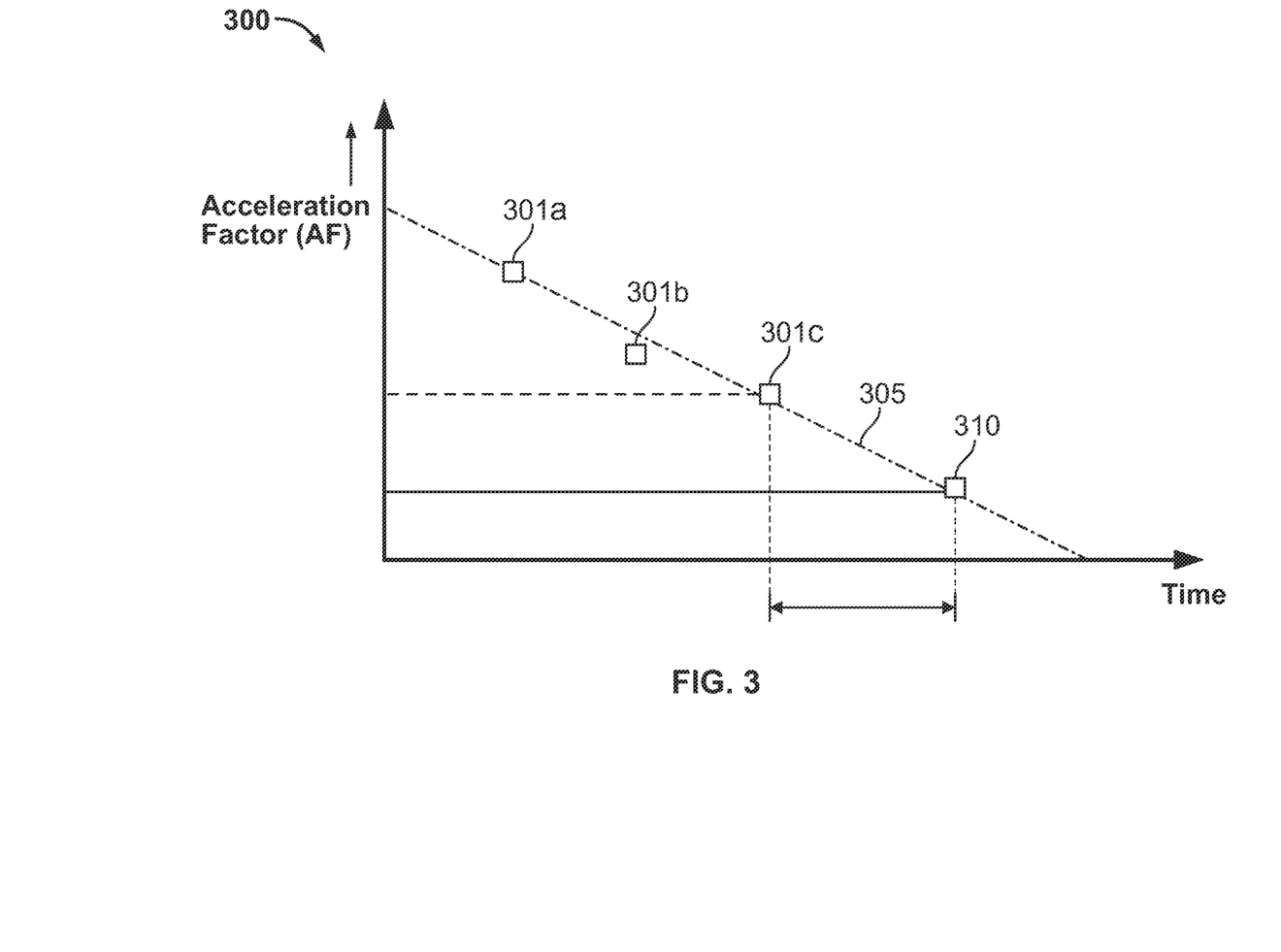
FIG. 3 shows an exemplary graph for determining a failure time of a PCBA.

FIG. 3 shows an exemplary graph for estimating a time to failure for a PCBA from failure times obtained from the exemplary prognostic sensors. Graph 300 shows acceleration factor (AF) plotted along the y-axis and time plotted along the x-axis. Points 301a, 301b and 301c indicate a failure point of exemplary prognostic sensors having separate acceleration factors. A trend line 305 can be drawn in relation to these points and can be used to determine a failure time 310 of the PCBA. In one aspect, the estimated failure time corresponds to a time at which the trend line crosses a selected acceleration factor. Obtained failure times 310 can be used to determine a wear-out model for the PCBA, such as the exemplary model of FIG. 4, using for example the Weibull analysis discussed above.

Figure 4:
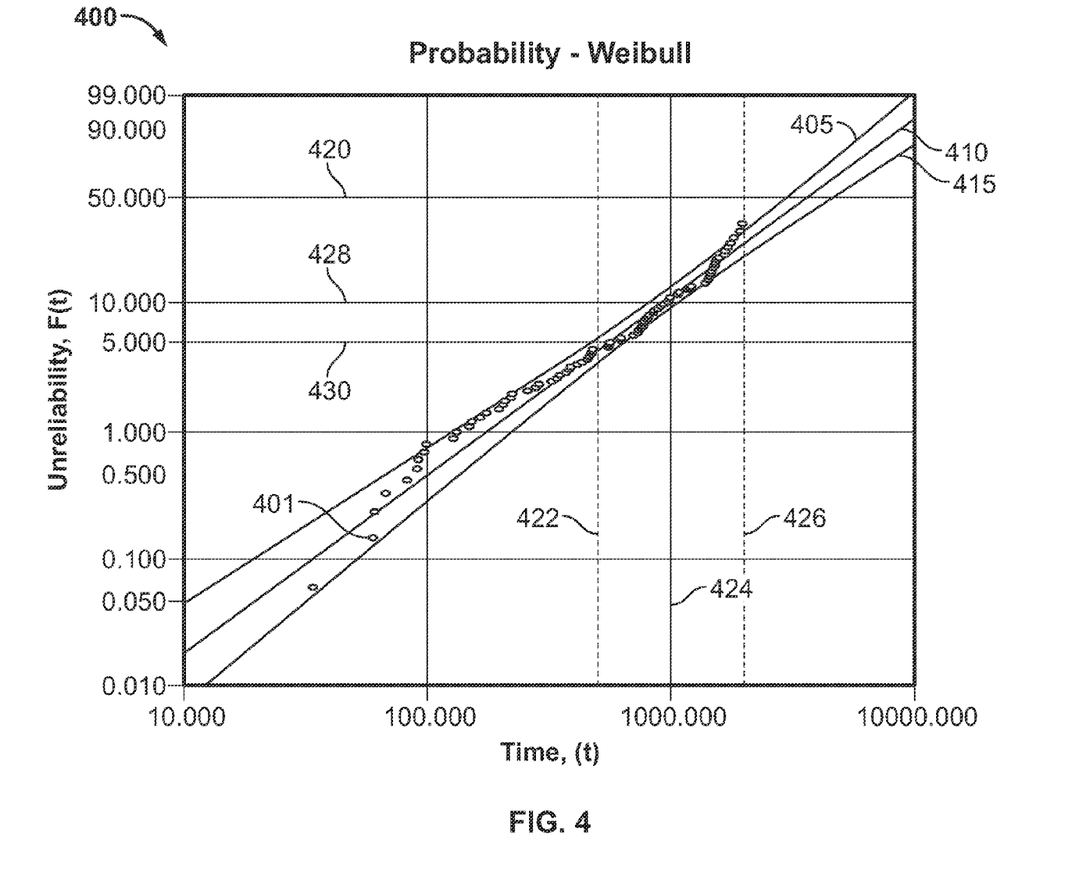
FIG. 4 shows an exemplary relation between reliability of a PCBA and time relation derived using the methods of the present disclosure.

FIG. 4 shows an exemplary wear-out model for a PCBA subjected to exemplary downhole conditions and drilling parameters. FIG. 4 shows a graph of unreliability vs. time for the exemplary PCBA. Unreliability is plotted along the y-axis on a logarithmic scale. Time is plotted along the x-axis on a logarithmic scale. The plurality of data points 401 can be obtained from either historical data (from a PCBA downhole) or test data (from a PCBA in a controlled testing environment) or a combination thereof. Also shown are a best fit curve 410 to the plurality of data points as well as curves 405 and 415 representing an upper and lower bound of a region of 95% confidence level of the plurality of data points. Table 9 below is related to the graph 400 and indicates various selected places on the graph for the exemplary PCBA.

TABLE 9

Reliability Prediction of Exemplary PCBA

| Confidence Level (90%) | Upper Bound | Results | Lower Bound |
|---|---|---|---|
| Mean Life | 5341 hours | 4211 hours | 3321 hours |
| Reliability of Mission End Time (500 hours) | 0.9655 | 0.9568 | 0.9460 |

TABLE 9-continued

Reliability Prediction of Exemplary PCBA

| Confidence Level (90%) | Upper Bound | Results | Lower Bound |
|---|---|---|---|
| Reliability of Mission End Time (1000 hours) | 0.9075 | 0.8898 | 0.8689 |
| Reliability of Mission End Time (2000 hours) | 0.7821 | 0.7344 | 0.6785 |
| Warranty Time (Required Reliability 0.90) | 1060 hours | 929 hours | 814 hours |
| Warranty Time (Required Reliability 0.95) | 649 hours | 556 hours | 476 hours |

As seen in Table 9, the exemplary PCBA has a mean lifetime of 4211 hours, with a lower bound of 3321 hours and an upper bound of 5341 hours. This is indicated at the intersection of curves 410, 405 and 415, respectively, with horizontal line 420 indicating 50% unreliability. At a mission time of 500 hours (vertical line 422), the reliability of the PCBA is 95.68% with a lower bound of 94.6% and an upper bound of 96.55%. At a mission time of 1000 hours (vertical line 424), the reliability of the PCBA is 88.98% with a lower bound of 86.89% and an upper bound of 90.75%. At a mission time of 2000 hours (vertical line 426), the reliability of the selected part is 73.44% with a lower bound of 67.85% and an upper bound of 78.21%.

In order to operate a PCBA to 90% reliability (horizontal line 428), the PCBA can be operated for 929 hours, with a lower bound of 814 hours and an upper bound of 1060 hours. In order to operate the PCBA to 95% reliability (horizontal line 430), the PCBA can be operated for 556 hours, with a lower bound of 476 hours and an upper bound of 649 hours.

In one aspect, the exemplary wear-out model of FIG. 4 can be used to provide an early warning of failure of a PCBA used downhole in later drilling operations. Additionally, the wear-out model can be used to extend maintenance cycles, avoid scheduled maintenances or forecast a desirable time for maintenance. In another aspect, the wear-out model can be used to assess the potential for extending the life of a PCBA, thereby reducing a need for redundancy of parts. The wear-out model can also be used in PCBA designs and qualification methods for parts in development.

Figure 5:
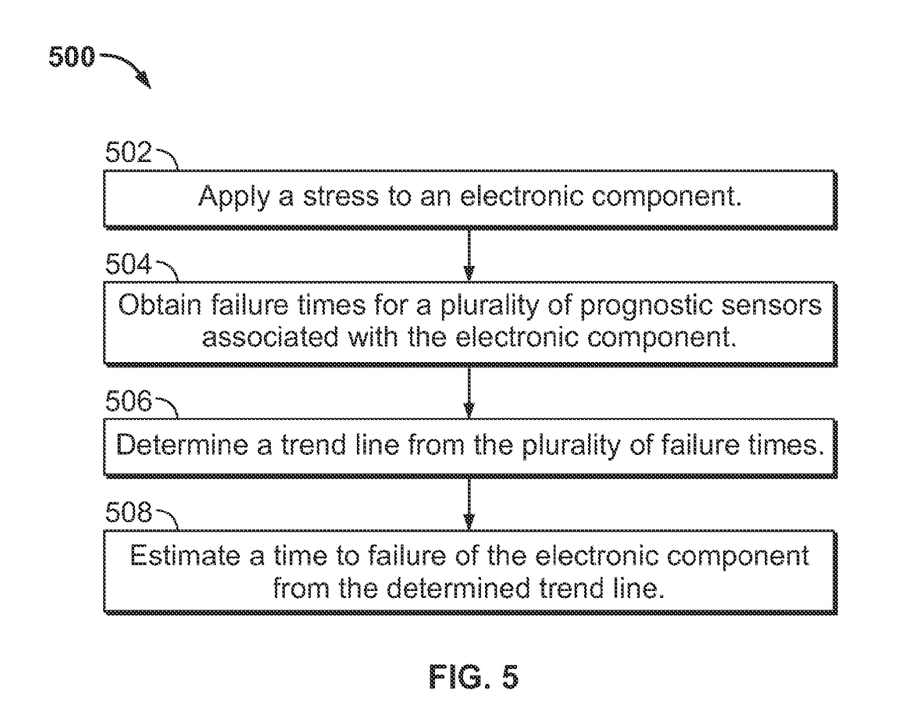
FIG. 5 shows a flowchart of an exemplary method for determining a time to failure of a PCBA in an embodiment of the present disclosure.

FIG. 5 shows a flowchart of an exemplary method for estimating a time to failure for a PCBA. In Box 502, a stress is applied to the PCBA. The stress can be applied in a downhole environment or in a controlled testing environment simulating a downhole environment or an accelerated environmental condition. In Box 504, failure times for a plurality of prognostic sensors associated with the PCBA are obtained. In Box 506, a trend line is determined that is related to the obtained failure times. In Box 508, a time to failure for the PCBA is estimated from the determined trend line.

In various aspect, the methods and measurements of the present disclosure can be performed on a PBCA downhole, i.e., disposed in a borehole on a drillstring, or a surface location, such as a controlled testing environment. In addition, the failure of a PCBA downhole can be estimated by a comparison of a stress profile at the PCBA with an exemplary wear-out model such as shown in FIG. 4.

Therefore, in one aspect, the present disclosure provide a method of estimating a time to failure of an electronic component used in a downhole environment, including: applying a stress to cause failure of a plurality of prognostic sensors associated with the electronic component, wherein the stress level at which a prognostic sensor fails is indicative of a stress level at which the electronic component fails; obtaining failure times of the plurality of prognostic sensors; determining a trend from the obtained failure times of the prognostic sensors; and estimating the time of failure of the electronic component from the determined trend. The failure times of the prognostic sensors can be determined using an acceleration factor that is selected to correspond to a wear-out model. The stress can include at least lateral vibration, stickslip, axial vibration, and temperature, for example. The method further includes monitoring a stress level of the applied stress to obtain a stress profile. The monitored stress level can be correlated to a time parameter, wherein the time parameter is one of i) a failure time of a prognostic sensor, ii) a failure time of the electronic component, and iii) a time to suspension of use of the electronic component. A wear-out model of the electronic component can then be from the obtained failure times and the obtained stress profiles. In various embodiments, stress can be applied at one of: (i) a downhole location; and (ii) a controlled testing environment. In a particular embodiment, wherein the electronic component is a printed circuit board assembly.

In another aspect, the present disclosure provides an apparatus for estimating a time to failure of an electronic component in a downhole environment that includes a plurality of prognostic sensors associated with the electronic component configured to fail at stress levels indicative of a failure stress level of the electronic component; and a processor configured to: obtain failure times of the prognostic sensors, determine a trend of the obtained failure times, and estimate the time of failure of the electronic component from the determined trend. The processor can be further configured to obtain failure times of the prognostic sensors using an acceleration factor, wherein the acceleration factor is selected to correspond to a wear-out model. The applied stress can include a lateral vibration, stickslip, axial vibration, and temperature. In various embodiments, the apparatus includes a measurement sensor configured to monitor a stress level at the electronic component, and the processor obtains a stress profile from the monitored stress level. The processor can correlate the monitored stress level to a time parameter that is one of: (i) a failure time of a prognostic sensor; (ii) a failure time of the electronic component, and (iii) a time to suspension of use of the electronic component. The processor can create a wear-out model of the electronic component from the obtained failure times and the obtained stress profiles. The stress can be applied via one of: (i) placing the electronic component in a downhole location; and (ii) operating a stress simulator coupled to the electronic component. In a particular embodiment, the electronic component is a printed circuit board assembly.

While the foregoing disclosure is directed to the preferred embodiments of the disclosure, various modifications will be apparent to those skilled in the art. It is intended that all variations within the scope and spirit of the appended claims be embraced by the foregoing disclosure.

What is claimed is:

1. A method of estimating a time to failure of an electronic component used in a downhole environment, comprising:
    applying a stress to cause failure of a plurality of prognostic sensors associated with the electronic component, wherein a stress level at which a prognostic sensor fails is related to a stress level at which the electronic component fails by an acceleration factor of the prognostic sensor, wherein an acceleration factor of at least one prognostic sensor is different than an acceleration factor of another of the plurality of prognostic sensors;
    obtaining failure times of the plurality of prognostic sensors;
    determining a plurality of failure points from the time of failure of the sensors and the acceleration factors of the sensors;
    determining a trend from the plurality of failure points; and
    estimating the time of failure of the electronic component from the determined trend.

2. The method of claim 1, wherein acceleration factor of a prognostic sensor indicates a rate at which the prognostic sensor fails with respect to the rate at which the electronic component fails.

3. The method of claim 2, wherein the acceleration factor is determined from a wear-out model.

4. The method of claim 1, wherein applying the stress includes applying at least one of: (i) lateral vibration; (ii) stickslip; (iii) axial vibration; and (iv) temperature.

5. The method of claim 1 further comprising monitoring the stress level at which the prognostic sensor fails to obtain a stress profile.

6. The method of claim 5 further comprising relating the monitored stress level to a time parameter.

7. The method of claim 6, wherein the time parameter is one of (i) a failure time of a prognostic sensor, (ii) a failure time of the electronic component, and (iii) a time to suspension of use of the electronic component.

8. The method of claim 5 further comprising creating a wear-out model of the electronic component from the obtained failure times and the obtained stress profiles.

9. The method of claim 1, further comprising applying the stress at one of: (i) a downhole location; and (ii) a controlled testing environment.

10. The method of claim 1, wherein the electronic component is a printed circuit board assembly.

11. An apparatus for estimating a time to failure of an electronic component in a downhole environment, comprising:
    a plurality of prognostic sensors associated with the electronic component, wherein a selected prognostic sensor is configured to fail at a stress level indicative of a failure stress level of the electronic component and an acceleration factor of the selected prognostic sensor, wherein the acceleration factor of the selected prognostic sensor is different that acceleration factor for another of the plurality of prognostic sensors; and
    a processor configured to:
        obtain failure times of the prognostic sensors,
        determine a plurality of failure points from the failure times of the prognostic sensors and the acceleration factors of the prognostic sensors;
        determine a trend from the plurality of failure points, and estimate the time of failure of the electronic component from the determined trend.

12. The apparatus of claim 11, wherein the acceleration factor is determined from a wear-out model.

13. The apparatus of claim 11, wherein the applied stress includes at least one of: (i) lateral vibration; (ii) stickslip; (iii) axial vibration; and (iv) temperature.

14. The apparatus of claim 11 further comprising a measurement sensor configured to monitor a stress level at the electronic component, wherein the processor is further configured to obtain a stress profile from the monitored stress level.

15. The apparatus of claim 14 wherein the processor is further configured to relate the monitored stress level to a time parameter.

16. The apparatus of claim 15, wherein the time parameter is one of: (i) a failure time of a prognostic sensor; (ii) a failure time of the electronic component, and (iii) a time to suspension of use of the electronic component.

17. The apparatus of claim 14 wherein the processor is further configured to create a wear-out model of the electronic component from the obtained failure times and the obtained stress profiles.

18. The apparatus of claim 11, wherein the stress is applied via one of: (i) placing the electronic component in a downhole location; and (ii) operating a stress simulator coupled to the electronic component.

19. The apparatus of claim 11, wherein the electronic component is a printed circuit board assembly.

* * * * *